United States Patent [19]
Liu

[11] Patent Number: 6,165,694
[45] Date of Patent: Dec. 26, 2000

[54] METHOD FOR PREVENTING THE FORMATION OF RECESSES IN BOROPHOSPHOSILICATE GLASS

[75] Inventor: Tsan-Wen Liu, Chi-Lung, Taiwan

[73] Assignee: United Semiconductor Corp., Hsin-chu, Taiwan

[21] Appl. No.: 09/023,235

[22] Filed: Feb. 13, 1998

[30] Foreign Application Priority Data

Sep. 20, 1997 [TW] Taiwan ................................. 86113670

[51] Int. Cl.[7] ....................................................... G03F 7/00
[52] U.S. Cl. ............................ 430/313; 430/327; 134/1.3
[58] Field of Search .................................... 430/313, 314, 430/327; 134/1.3, 42

[56] References Cited

U.S. PATENT DOCUMENTS

| | | |
|---|---|---|
| 4,732,658 | 3/1988 | Lee .......................................... 437/228 |
| 5,157,002 | 10/1992 | Moon ...................................... 437/228 |
| 5,817,572 | 10/1998 | Chiang et al. .......................... 438/624 |
| 5,908,509 | 6/1999 | Olesen et al. ............................ 134/1.3 |

*Primary Examiner*—Kathleen Duda
*Attorney, Agent, or Firm*—Merchant & Gould P.C.

[57] ABSTRACT

A method for preventing the formation of recesses in the surface of a borophosphosilicate glass layer comprising the step of first forming a borophosphosilicate glass layer over a substrate, then forming a silicon nitride film having a thickness of about 300Å to 1000Å over the borophosphosilicate glass layer. Next, contact windows are formed, followed by cleaning with an RCA solution. The silicon nitride film provides a protective function preventing the formation of recesses on the borophosphosilicate glass surface. Consequently, no short-circuiting metal bridges caused by metal in the recesses after the deposition of metallic conducting wires are formed.

10 Claims, 5 Drawing Sheets ed in and constitute a part of this specification.

METHOD FOR PREVENTING THE FORMATION OF RECESSES IN BOROPHOSPHOSILICATE GLASS

CROSS-REFERENCE TO RELATED APPLICATION

This application claims the priority benefit of Taiwan application serial no. 86113670, filed Sep. 20, 1997.

BACKGROUND OF THE INVENTION

1. Field of Invention

The present invention relates to a planarization process using borophosphosilicate glass. More particularly, the present invention relates to a method for preventing the formation of recesses in the borophosphosilicate glass (BPSG) surface caused by rinsing during wafer-cleaning operation. Without the recesses, the possibility of metal bridges linking different metal interconnects and leading to a short-circuiting of the interconnect lines in subsequent metal laying operation will be avoided.

2. Description of Related Art

Borophosphosilicate glass (BPSG) has a rather low glass transition temperature and therefore can easily flow in a thermal operation. Moreover, boropliosphosilicate glass has a much lower residual mechanical stress than an ordinary silicon dioxide layer because of the boron and phosphorus present. Consequently, borophosphosilicate glass is now extensively used as the first dielectric material for laying over a substrate after MOS devices are formed in the wafer. Especially, the BPSG serves as inter dielectric medium for carrying out the planarization procedures before the metallization operation.

In general, the transition temperature of borophosphosilicate glass depends on the amount of boron and phosphorus present, and will normally decrease with an increasing amount of those elements. However, when the amount of boron and phosphorus inside the borophosphosilicate glass is too high, the borophosphosilicate glass itself is not too stable. Subsequently, in the process of cleaning using a RCA solution, the phosphorus inside the BPSG will react with the constituents of the solution and form recesses on the surface of the originally planar BPSG layer. Therefore, the amount of boron and phosphorus inside the BPSG must be controlled within definite limits.

The conventional method to reduce the recesses in the BPSG layer due to cleaning is to monitor the concentration of the doped substances using a control wafer and generate an optimized concentration. When the concentration level of phosphorus inside BPSG actually changes, the change can only be discovered later. In other words, the conventional method can only give the actual concentration level of added phosphorus inside BPSG, but could not make any immediate response to restore back to a fixed concentration level.

FIGS. 1A through 1D are cross-sectional views showing a series of preparatory steps necessary prior to metallization including planarizing borophosphosilicate glass layer, etching contact opening and final cleaning operation according to a conventional method. First, as shown in FIG. 1A, a substrate 10 having a MOS structure already formed thereon is provided. The MOS structure includes a field oxide layer 11, a gate 12 and source/drain terminals 13 and 14. Then, a borophosphosilicate glass layer 15 is formed above the substrate 10. This is followed by a planarization process. In the subsequent step, as shown in FIG. 1B, a photoresist layer is formed over the borophosphosilicate glass layer 15 and then patterned to form a mask 16. Using the mask 16 as a protective layer, those portions of the borophosphosilicate glass layer 15 not covered by the mask are removed forming contact windows 17. After the removal of the photoresist mask layer 16, a structure as shown in FIG. 1C is obtained. Next, the substrate 10 is cleaned using a RCA solution. Because the phosphorus in a BPSG layer can easily react with the constituents in the RCA solution, the phosphorus on the surface of a BPSG layer can be removed during cleaning operation. If the BPSG layer 15 has an inappropriate level of phosphorus concentration, phosphorus on the surface of the BPSG layer 15 can be leached away during the cleaning operation to form recesses 18 as shown in FIG. 1D. Subsequently, when metal is deposited into the contact windows 17, the recesses 18 will also be filled and the metal there is difficult to remove. These metal-filled recesses now act as 'bridges' connecting different metal lines leading to short-circuit. FIG. 1E is a top view showing the surface of a borophosphosilicate glass layer after a metal laying operation. After cleaning with a RCA solution, recesses 18 are formed on the borophosphosilicate glass 15 surface. When the recesses adjacent to the contact windows 17 are linked together through a metal deposition, bridging will occur resulting in short-circuit between two supposedly unconnected metal conducting wires.

In light of the foregoing, there is a need in the art to provide a method for preventing the formation of recesses in the borophosphosilicate glass layer.

SUMMARY OF THE INVENTION

Accordingly, the present invention is directed to provide a method for preventing the formation of recesses on a borophosphosilicate glass surface. The method is to form a thin silicon nitride film that acts as a protective shield over the borophosphosilicate glass surface such that subsequent damages by RCA cleaning solution is reduced to a minimum. Since no recesses are formed on the borophosphosilicate glass surface, no bridging connections are established during subsequent metal deposition process. Therefore, there is no short-circuiting between independent metallic conducting lines.

To achieve these and other advantages and in accordance with the purpose of the invention, as embodied and broadly described herein, the invention provides a method for preventing the formation of recesses on a borophosphosilicate glass surface. The method comprises the steps of first forming a layer of insulating material, for example, a silicon nitride film having a thickness of about 300Å to 1000Å, over the borophosphosilicate glass layer. Then, a patterned mask is produced followed by removing, portions of the silicon nitride film and the borophosphosilicate glass layer not covered by the mask to form contact windows. Subsequently, an RCA solution is used to clean the surfaces to remove unwanted impurities. Due to the covering by a protective silicon nitride film, the smooth plane surface of the borophosphosilicate glass layer will not be damaged by the RCA cleaning solution. Even if the concentration level of doped phosphorus in the borophosphosilicate glass has changed somewhat during a previous processing step, the problems of recesses formation will not be intensified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
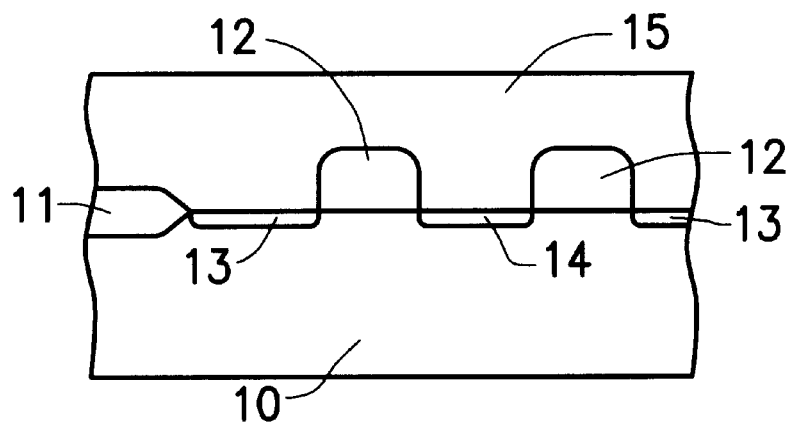
FIGS. 1A through 1D are cross-sectional views showing a series of preparatory steps necessary prior to metallization including planarizing borophosphosilicate glass layer, etching contact opening and final cleaning operation according to a conventional method.
Figure 1B:
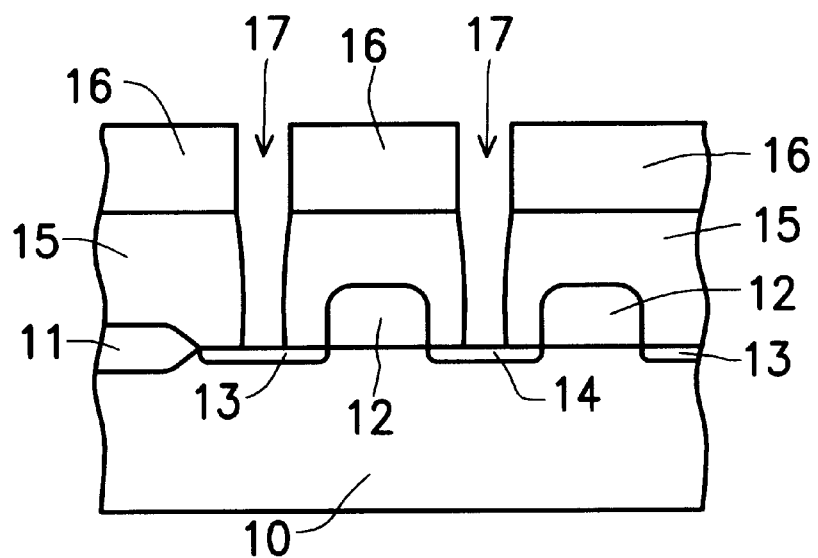
Figure 1C:
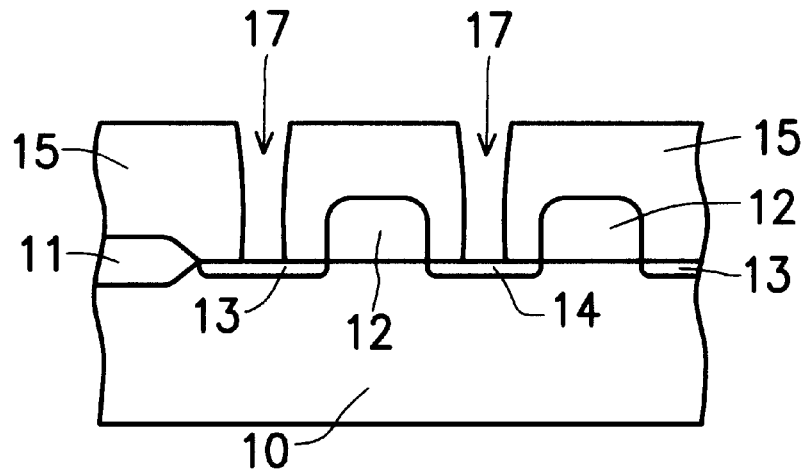
Figure 1D:
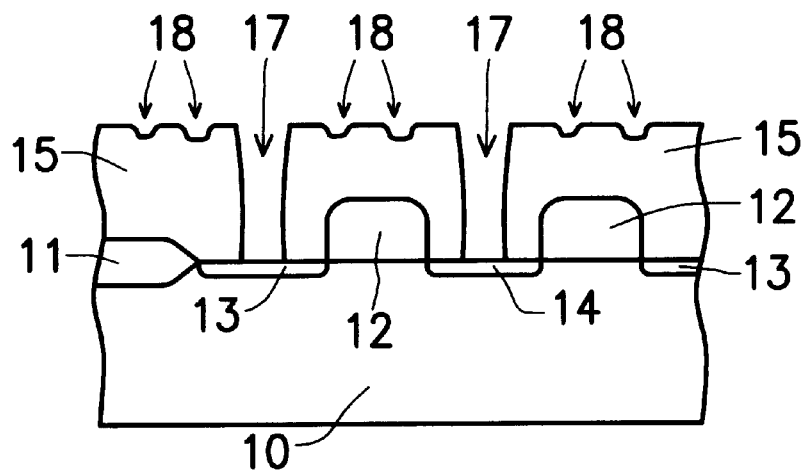
Figure 1E:
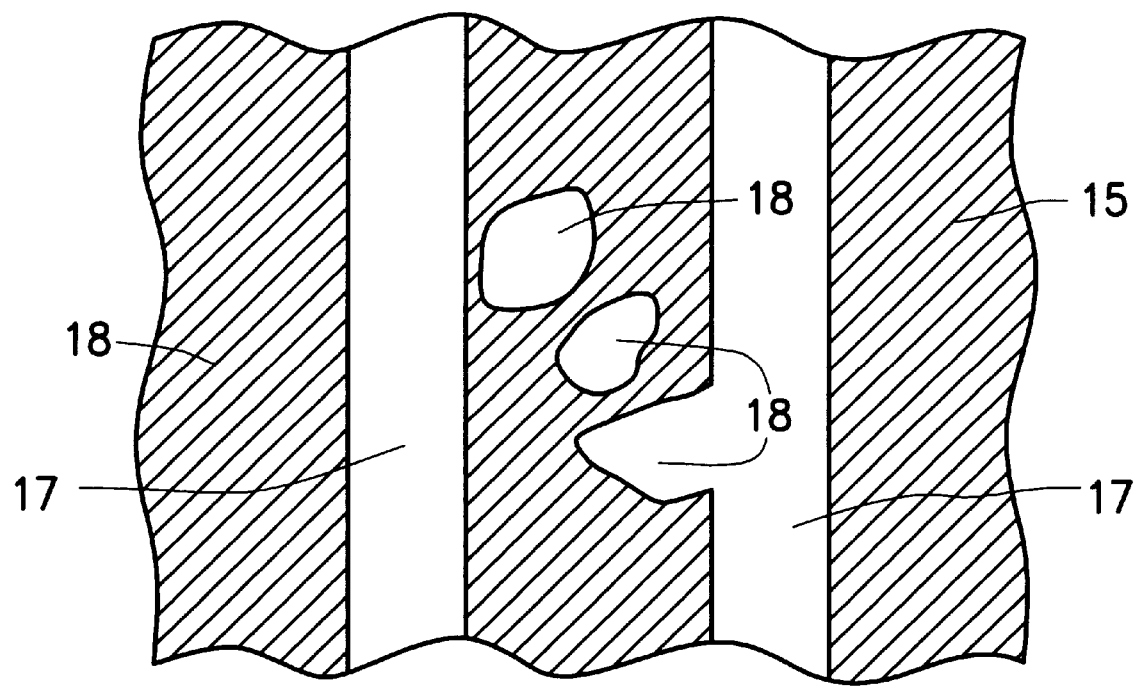
FIG. 1E is a top view showing the surface of a borophosphosilicate glass layer after a metal laying operation following the steps in a conventional method.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
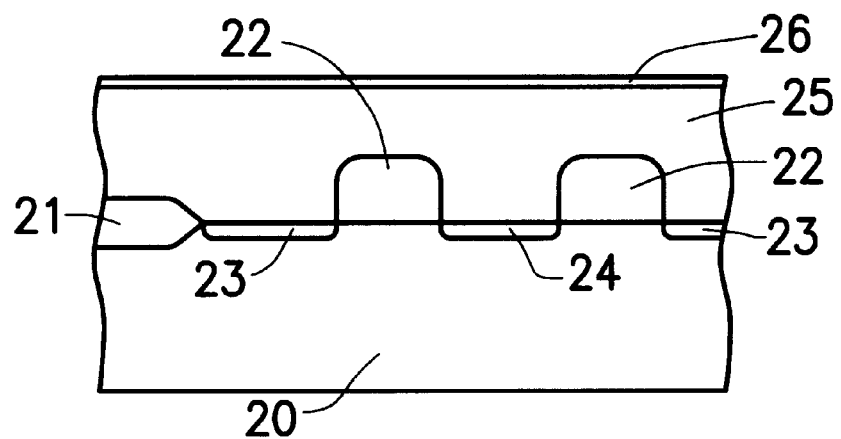
FIGS. 2A through 2C are cross-sectional views showing a series of preparatory steps necessary prior to metallization including planarizing borophosphosilicate glass layer, etching contact opening and final cleaning operation according to one preferred embodiment of this invention.
Figure 2B:
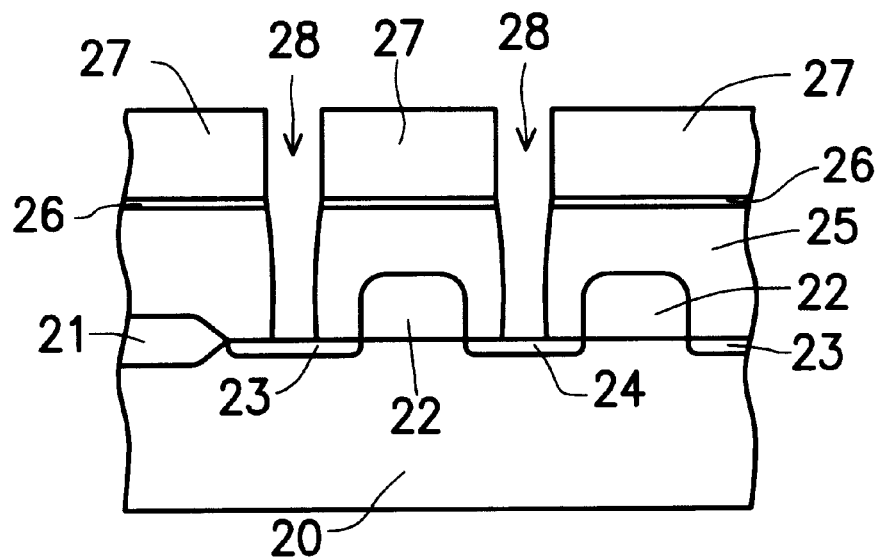
Figure 2C:
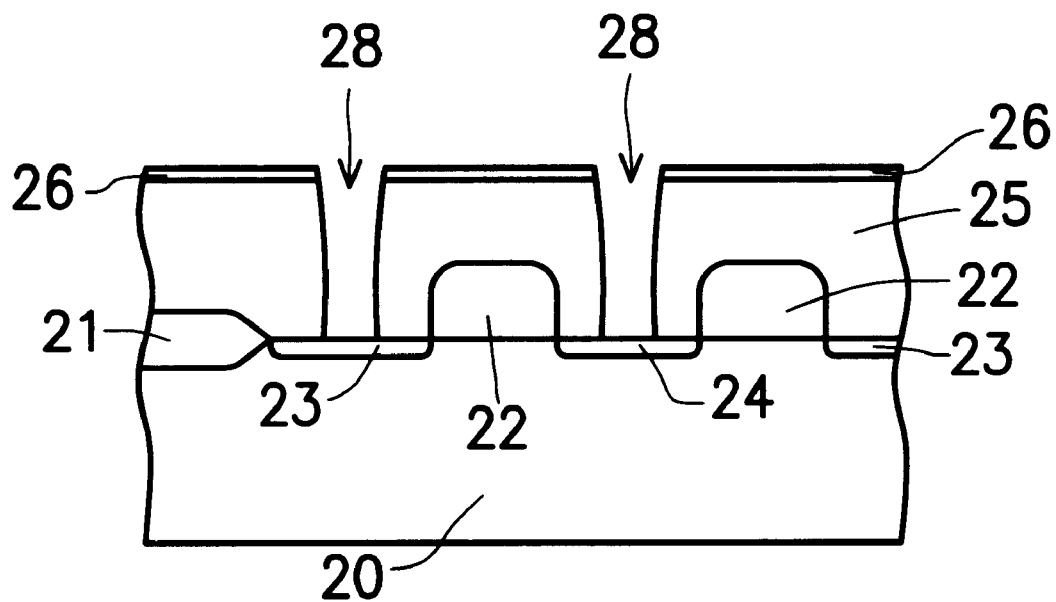

FIGS. 2A through 2C are cross-sectional views showing a series of preparatory steps necessary prior to metallization including planarizing borophosphosilicate glass layer, etching contact opening and final cleaning operation according to one preferred embodiment of this invention. As shown in FIG. 2A, a substrate 20 having structures such as field oxide layer 21, gate 22, source/drain terminals 23 and 24 already formed thereon is provided. Since the substrate 20 has an uneven surface with those structures on top, planarization is carried out by forming a layer of borophosphosilicate glass layer 25 over the substrate 20. Thereafter, a layer of insulating material, for example, a thin film of silicon nitride 26 having a thickness of about 300Å to 1000Å is formed over the borophosphosilicate glass layer 25.

Next, as shown in FIG. 2B, a photoresist layer 27 is formed over the silicon nitride film 26 and then patterned to form a photoresist mask. Subsequently, the exposed portions of the silicon nitride film 26 and the borophosphosilicate glass layer 25 are removed to form a contact window 28 above the source/drain terminals 23 and 24.

Finally, as shown in FIG. 2C, the photoresist layer 27 is removed, and then the surface is cleaned to remove unwanted impurities using an RCA solution which includes $H_2O_2$, $NH_4OH$ and deionized water. Because the silicon nitride film 26 covers the borophosphosilicate glass 25 surface, it protects the glass surface against attack by the RCA solution. Hence, the glass surface will not be damaged to form recesses as in a conventional method even when the phosphorus content of the borophosphosilicate glass layer is above normally. Consequently, metal bridges formed by residual deposited metal in the recesses will not be produced, and there is no short-circuiting between different metallic conducting wires.

Therefore, the characteristic of this invention is the formation of a layer of insulating material such as silicon nitride film over the borophosphosilicate glass layer. The silicon nitride film serves as a protective layer preventing the formation of recesses on the borophosphosilicate glass surface caused by the cleaning action of an RCA solution. When metal is subsequently deposited into the contact windows to form metallic conducting wires, there will be no residual metal in recesses capable of forming metal bridges linking up the independent metal lines, thereby causing short-circuiting.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for preventing the formation of recesses in borophosphosilicate glass used for the planarization of a substrate, comprising the steps of:

forming a borophosphosilicate glass layer over a substrate;

forming an insulating layer on the borophosphosilicate glass (BPSG) layer to prevent formation of recesses on the surface of the BPSG layer during a cleaning process;

removing portions of the insulating layer and the borophosphosilicate glass layer to form a plurality of contact windows; and after forming the contact windows, cleaning exposed surfaces of the remaining insulating layer on the remaining BPSG layer with a cleaning solution.

2. The method of claim 1, wherein the step of forming the insulating layer includes depositing a thin film of silicon nitride.

3. The method of claim 2, wherein the silicon nitride film has a thickness of 300Å to 1000Å.

4. The method of claim 2, wherein the step of forming the silicon nitride film includes using a low pressure chemical vapor deposition method.

5. The method of claim 1, wherein the step of removing portions of the insulating layer and the borophosphosilicate glass layer includes using photolithographic and etching processes.

6. The method of claim 4, wherein the step of removing portions of the insulating layer and the borophosphosilicate glass layer includes the following substeps:

forming a photoresist layer over the insulating layer;

patterning the photoresist layer to form a mask, then removing portions of the insulating layer and the borophosphosilicate glass layer to form a plurality of contact windows; and removing the photoresist layer.

7. A method for preventing the formation of recesses in borophosphosilicate glass, comprising the steps of:

providing a substrate;

forming a borophosphosilicate glass layer over the substrate;

forming an insulating layer on the borophosphosilicate glass (BPSG) layer to prevent formation of recesses on the surface of the BPSG layer during a cleaning process;

forming a photoresist layer over the insulating layer;

patterning the photoresist layer to form a mask, and then removing portions of the insulating layer and the borophosphosilicate glass layer to form a plurality of contact windows;

removing the photoresist layer; and cleaning the exposed surfaces of the remaining insulating layer on the remaining BPSG layer with a cleaning solution.

8. The method of claim 7, wherein the step of forming the insulating layer includes depositing a thin film of silicon nitride.

9. The method of claim 8, wherein the step of forming the silicon nitride film includes using a low pressure chemical vapor deposition method.

10. The method of claim 8, wherein the silicon nitride film has a thickness of 300Å to 1000Å.

* * * * *